United States Patent [19]
Gianni et al.

[11] Patent Number: 6,058,022
[45] Date of Patent: May 2, 2000

[54] UPGRADEABLE PCB WITH ADAPTABLE RFI SUPPRESSION STRUCTURES

[75] Inventors: Robert R. Gianni, Los Gatos; Gary C. Croak, San Jose, both of Calif.

[73] Assignee: Sun Microsystems, Inc., Palo Alto, Calif.

[21] Appl. No.: 09/003,722

[22] Filed: Jan. 7, 1998

[51] Int. Cl.[7] .................................................. H05K 1/18
[52] U.S. Cl. .......................... 361/794; 361/780; 257/728; 333/12; 333/247; 439/109
[58] Field of Search .................. 361/763, 777, 361/780, 794; 333/12, 185, 246, 247; 257/728; 174/261, 262; 439/92, 95, 101, 108, 109, 941, 947

[56] References Cited

U.S. PATENT DOCUMENTS

| | | | |
|---|---|---|---|
| 5,068,631 | 11/1991 | Vince | 333/12 |
| 5,165,055 | 11/1992 | Metsler | 333/12 |
| 5,682,298 | 10/1997 | Raynham | 361/794 |
| 5,736,796 | 4/1998 | Price et al. | 361/794 |
| 5,764,491 | 6/1998 | Tran | 361/794 |
| 5,777,854 | 7/1998 | Welch et al. | 361/800 |
| 5,912,809 | 6/1999 | Steigerwald et al. | 361/780 |
| 5,923,540 | 7/1999 | Asada et al. | 361/794 |

*Primary Examiner*—Leo P. Picard
*Assistant Examiner*—John B. Vigushin
*Attorney, Agent, or Firm*—Beyer Weaver Thomas & Nguyen

[57] ABSTRACT

Disclosed is a printed circuit board that includes selectable structures for attenuating EMI/RFI of replaceable components. In one preferred embodiment, the printed circuit board has a power plane that is subdivided into a plurality of power islands, a ground plane, a plurality of bypass capacitors, and a connector mounted on the printed circuit board for receiving electrical components. Each bypass capacitor is connected between the ground plane and an associated one of the power islands. The connector is connected to at least two selected power island, and the selected power islands are arranged such that when a first electrical component is inserted into the connector, a first one of the selected power islands is automatically connected to a power supply pin of the first electrical component to facilitate attenuation of electromagnetic interference generated by the first electrical component in a first frequency band. Likewise, when a second electrical component is inserted into the connector, a second one of the selected power islands is automatically connected to a power supply pin of the second electrical component to facilitate attenuation of electromagnetic interference generated by the second electrical component in a second frequency band that is different then the first frequency band.

36 Claims, 7 Drawing Sheets

UPGRADEABLE PCB WITH ADAPTABLE RFI SUPPRESSION STRUCTURES

BACKGROUND OF THE INVENTION

The present invention relates generally to printed circuit boards (PCBs) and, more particularly, to methods and apparatus for suppressing radio frequency interference (RFI) or electromagnetic interference (EMI) generated by replaceable components on the printed circuit boards.

Currently, in order to remain competitive in the electronics industry, PCB designers must continuously reduce design time and corresponding cost. Thus, one trend is towards designing the PCB to include replaceable modular components. By using replaceable modular components, a designer may then upgrade and replace components on a PCB as new versions of components are made available. This trend is especially prevalent in the computer industry, where computer systems may be designed to include replaceable components.

FIG. 1 is a simplified, exploded perspective view of a conventional computer system 100. The computer system 100 includes a main logic board 102, a computer case 120, a fan housing 150 a hard drive 140, a power supply (not shown), and a floppy drive and CD-ROM drive 130. The brain of the computer system is the main logic board 102, commonly referred to as a central processing unit (CPU) board or "motherboard." The motherboard is basically a special PCB that includes the electronic circuitry that actually makes up the computer.

For example, the motherboard 102 may include a plurality of memory connectors 104 for receiving memory modules 106, a plurality of option connectors 112 for receiving option cards (not shown), a plurality of power connectors 118 for receiving power, an application specific integrated circuit (ASIC), a connector 108 for receiving a CPU module 110, and a fan housing 119.

Many of the components and associated connectors of the motherboard 102 may be configured to be upgradeable. For example, the connector 108 for the CPU module 110 may be designed to enable replacement of the CPU module 110. As shown, the CPU module 110 may then be inserted perpendicularly into the connector 108 on the motherboard 102. Thus, when a newer, faster CPU is designed, one may remove the older, slower CPU module and replace it with the newer, faster CPU module.

Although conventionally designed motherboards that include replaceable components have many advantages, these motherboards also present a number of problems. For example, as designers increase the operating frequency of individual components (e.g., CPU's), it becomes more difficult to meet the Federal Communication Commission's (FCC) requirements for devices that may emit radio frequency interference (RFI) or electromagnetic interference (EMI).

This RFI/EMI effect is especially prevalent in electronics products that operate at high frequencies. For example, a CPU that operates at 300 MHz may have a detrimental RFI/EMI effect at a third harmonic (e.g., three times the base frequency) of 900 MHz. Coincidentally, telephones operate at about 900 MHz, and thus a 300 MHz CPU may interfere with telephone communication if the computer system is not designed to attenuate RFI/EMI at 900 MHz.

Consequently, the FCC has strict guidelines that require electronics products to eliminate or substantially reduce RFI/EMI effects such that the operation of a particular electronics product will not substantially interfere with other communication devices (e.g., telephones and radios). Specifically, the energy emitted at certain proscribed frequencies by high frequency devices must be attenuated to levels that are within FCC limits. The details of the FCC guidelines are complex, and thus, will not be further described. However, the guidelines are laid out in Part 15 of the FCC Rules, which document is herein incorporated by reference in its entirety.

In order to comply with these stringent FCC requirements, systems designers typically add a network of bypass capacitors to the motherboard so as to bypass a range of high frequencies. For example, a network of bypass capacitors are typically added to the back surface of the motherboard and are connected between a ground plane and a power plane of the motherboard 102. These capacitors are configured to attenuate RFI/EMI for a limited range of frequencies. Typically, this range of frequencies will only include frequencies emitted from one type of component. That is, the capacitors are configured to suppress RFI/EMI for one type of component which operates at one particular frequency or a relatively small range of frequencies.

FIG. 2 is a simplified cut away top view of a portion of a motherboard 202 that includes the conventional power plane 215. The power plane 215 is typically used for routing power to power supply pins of various components on the mother board 202. In this example, the power plane 215 is electrically coupled to a particular component's interconnect holes 211 on the motherboard 202. That is, when the particular component is mounted onto the motherboard 202, a power supply pin of the particular component is then electrically coupled to the power plane 215. Similarly, when a power supply (not shown) is electrically coupled to a power input connector 213, the power supply is then electrically coupled to the power plane 215. As shown, power is routed from interconnect holes of the power input connector 213 to interconnect holes of components 205, 207, and 209.

Typically, each pin of the power input connector 213 is electrically connected to a power supply (not shown) having a particular voltage. For example, a pin 217 of the power input connector 213 may be connected to a 5 volt power supply. Another pin (e.g., 219) of the power input connector 213 may be connected to a different voltage and routed to other power planes (not shown) on other levels of the motherboard 202.

Conventionally, there is one power plane per level, and each power plane is used for electrically connecting to any electrical component on the motherboard 202 that requires the particular power plane's voltage level. That is, if more than one voltage level is required for the motherboard components, another layer is utilized. For example, a 5 volt power plane may lie in one layer of the motherboard and be connected to all components that require 5 volts, while a 3 volt power plane may lie in another layer of the motherboard and be connected to all components that require 3 volts.

A motherboard that employs a conventional power plane to attenuate RFI/EMI at a range of frequencies has many disadvantages. One problem with the conventional power plane is that the network of bypass capacitors coupled to the power plane only attenuate the RFI/EMI for a limited range of frequencies. That is, each time a component on the motherboard is replaced or upgraded, the network of bypass capacitors has to be reevaluated and redesigned. For example, additional capacitors may be required to bypass higher frequencies that are emitted from the new component.

This redesign of the network of bypass capacitors requires many man-hours of engineering since the engineers typically redesign the network of bypass capacitors through analysis and trial and error experiments. For instances, the engineer may need to add new capacitors to the existing capacitor network on the motherboard to filter the higher frequencies of a new electrical component, and then need to test these additional capacitors to determine whether to add more capacitors, whether to change some or all of their individual values, and whether to reposition some or all of the capacitors.

Accordingly, in view of the foregoing, there is a need for a motherboard with power planes that are designed to allow components that operate at a multiplicity of frequencies without requiring extensive redesign of the bypass capacitors on the motherboard. Additionally, there is a need for a method of implementing such a motherboard.

SUMMARY OF THE INVENTION

To achieve the foregoing and other objects and according to the purpose of the present invention, a printed circuit board is disclosed that includes selectable structures for attenuating EMI/RFI of replaceable components. In one preferred embodiment, the printed circuit board has a power plane that is subdivided into a plurality of power islands, a ground plane, a plurality of bypass capacitors, and a connector mounted on the printed circuit board for receiving electrical components. Each bypass capacitor is connected between the ground plane and an associated one of the power islands. The connector is connected to at least two selected power island, and the selected power islands are arranged such that when a first electrical component is inserted into the connector, a first one of the selected power islands is automatically connected to a power supply pin of the first electrical component to facilitate attenuation of electromagnetic interference generated by the first electrical component in a first frequency band. Likewise, when a second electrical component is inserted into the connector, a second one of the selected power islands is automatically connected to a power supply pin of the second electrical component to facilitate attenuation of electromagnetic interference generated by the second electrical component in a second frequency band that is different then the first frequency band.

Additionally, a computer system is disclosed that preferably includes the aforementioned printed circuit board, a grounded chassis for holding the printed circuit board, an I/O interface that includes a plurality of I/O connectors for electrically coupling a plurality of peripherals to the printed circuit board, and a cover that encloses the printed circuit board for protecting the printed circuit board from damage.

A method for automatically selecting a plurality of bypass capacitors on a printed circuit board when an electrical component of the printed circuit board is replaced or upgraded is also disclosed. In one preferred embodiment, the method includes providing a printed circuit board with a plurality of layers that include a first power plane and a first ground plane, the printed circuit board having a top surface and a bottom surface, and the first power plane having a plurality of independent power islands. The method also includes mounting a connector on the top surface of the printed circuit board such that the connector is connected to at least two selected power islands and mounting a plurality of bypass capacitors on the bottom surface of the printed circuit board such that each of the plurality of bypass capacitors are selected to electrically couple to the ground plane and an associated power island. The method further includes inserting a first electrical component in the connector and, upon insertion, automatically connecting a first one of the power islands to power supply pins of the first electrical component to facilitate attenuation of electromagnetic interference generated by the first electrical component at a first frequency.

In another embodiment, a printed circuit board for attaching electronic components is disclosed that includes a power plane, a ground plane, a plurality of capacitor networks, and a connector mounted on the printed circuit board for receiving electrical components. The connector is configured to couple a first one of the plurality of capacitor networks between the ground plane and the power plane when a first electrical component is inserted into the connector, and the first capacitor network is configured to facilitate attenuation of electromagnetic interference generated by the first electrical component in a first frequency band.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE PREFERRED EMBODIMENTS

Figure 1:
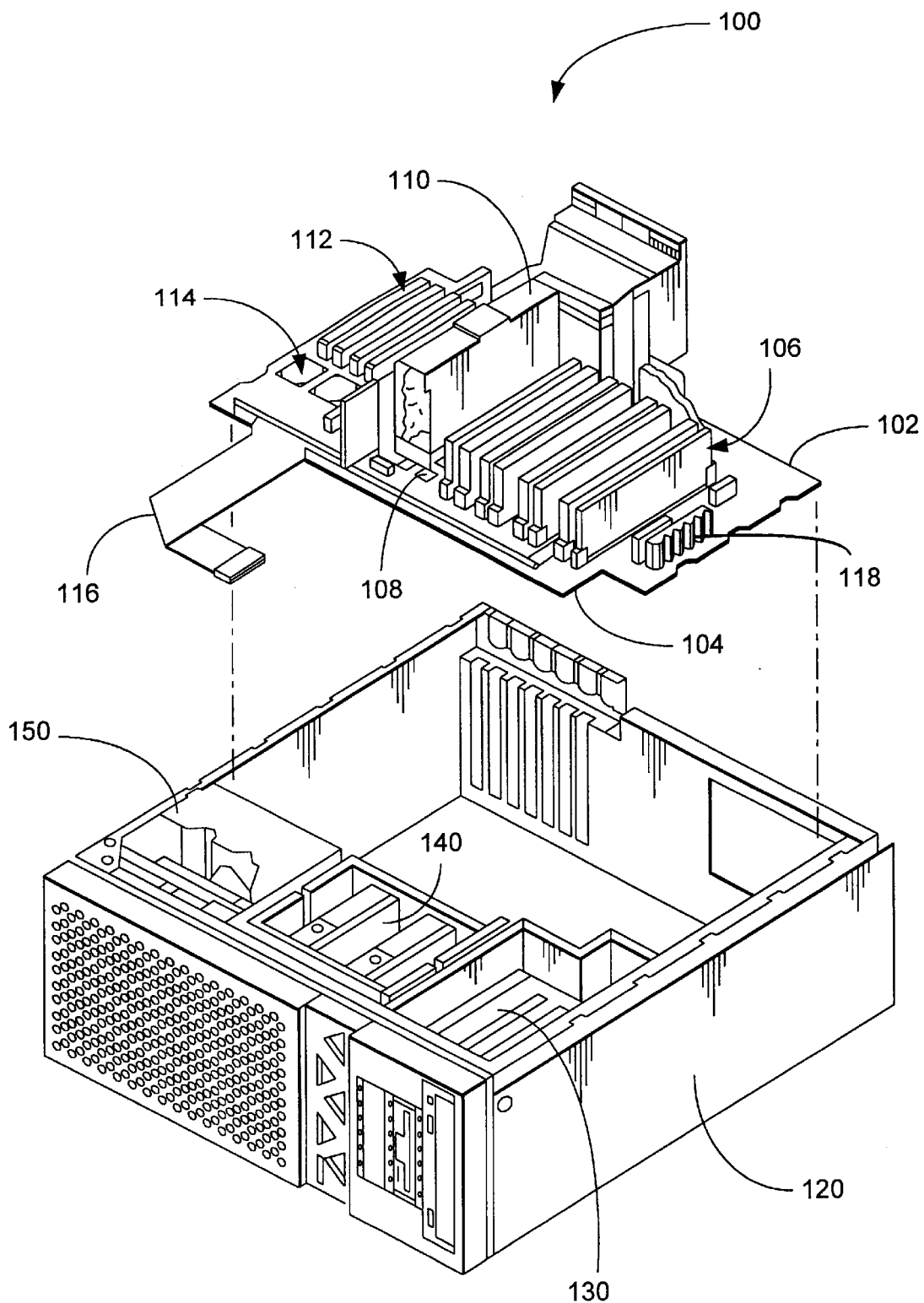
FIG. 1 is a simplified, exploded perspective view of a conventional computer system.
Figure 2:
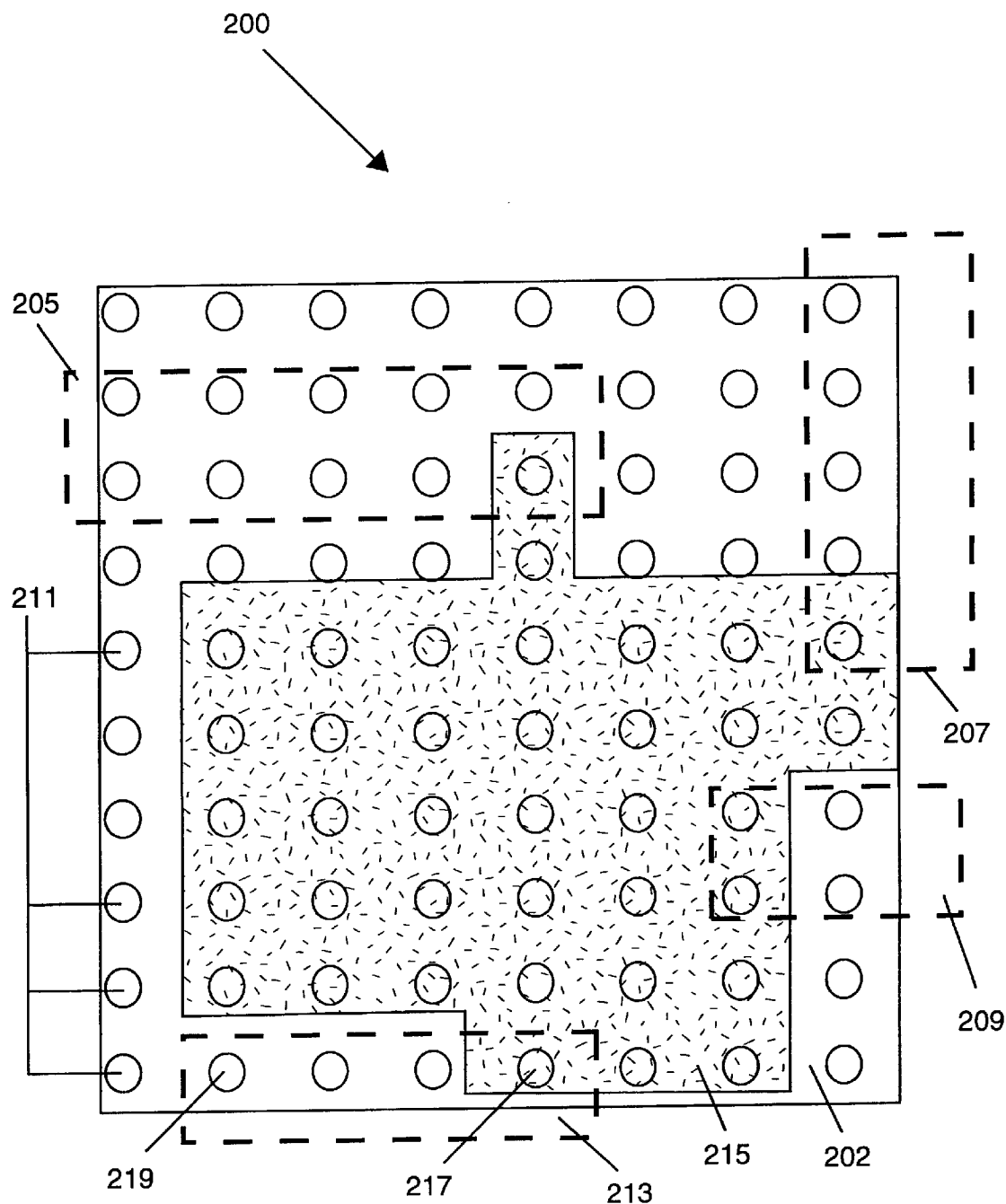
FIG. 2 is a simplified cut away top view of a portion of a motherboard that includes a conventional power plane.

An invention for an upgradeable PCB with adaptable RFI/EMI suppression structures is disclosed. In the following description, numerous specific details are set forth in order to provide a thorough understanding of the present invention. It will be understood, however, to one skilled in the art, that the present invention may be practiced without some or all of these specific details. In other instances, well known process operations and devices have not been described in detail in order not to unnecessarily obscure the present invention.

In general, the present invention includes EMI/RFI suppression structures that are configured to be adaptably selected upon insertion of particular replaceable components. In one embodiment, the EMI/RFI structures of the present invention include power planes that are subdivided into power islands, and each power island is individually configured to attenuate EMI/RFI for at least one frequency emanating from particular components. The power islands are configured so that when a component is inserted into a connector, appropriate power islands are automatically selected and connected to power pins of the inserted component. After the power islands are automatically selected, the selected power islands may then attenuate EMI/RFI at frequencies that are emitted by the inserted component.

The present invention may be implemented on any PCB that has upgradeable components for which RFI/EMI suppression is required. That is, any PCB that contains upgradeable components that operate at relatively high frequencies may implement the current invention. For example, a computer motherboard that includes a replaceable CPU module is one embodiment of the present invention. Although the following description is in reference to a computer motherboard, of course, it should be well understood by those skilled in the art that the application of the current invention is not limited to a motherboard, but may be implemented on any PCB that requires RFI/EMI suppression.

Turning back to FIG. 1, the motherboard 102 of the computer system 100 will now be described in more detail. The motherboard 102 typically is in the form of a printed circuit board that has a number of components mounted on a top surface of the motherboard 102. The printed circuit may be composed of a plurality of layers (not shown) that may include one or more of the following: power planes, ground planes, signal trace layers, and insulating layers. The insulating layers would, of course, be interspersed between two of the other layers.

As previously discussed, the motherboard 102 may include a plurality of memory connectors 104 for receiving at least one memory module 106. The memory connectors may take any form that is suitable for receiving any type of memory module that is used in computer systems. As shown, the memory connector 104 is in the form of a plurality of slots that are configured to receive at least one memory module 106 that is in the form of a dual inline memory module (DIMM) card.

Additionally, the motherboard 102 may include a plurality of option connectors 112 for receiving option modules (not shown). Option connectors are also commonly referred to as adapter card slots or option slots. An option module may be, for example, in the form of a sound card, extra serial or parallel port card, network card, video card, hard drive controller, or modem card. The option module typically performs functions related to a particular peripheral. For example, a modem card will manage communication between a modem and the other components of the computer system 100.

The motherboard 102 may also include one or more application specific integrated circuits (ASIC's) 114. Each ASIC performs specialized functions. For example, an ASIC may provide math coprocessing capability. The motherboard 102 also may include an I/O interface 116 for communicating between the motherboard 102 and external or internal peripherals.

The computer system 100 will also include a CPU. Additionally, the computer system may include support devices, such as a cache memory module and a buffer module. Of course, other computer system implementations may not require cache memory or data buffer modules. The CPU may be electrically coupled to these support devices. The CPU may be mounted separately onto the motherboard 102, or packaged together in a CPU module 110 as shown.

Figure 6:
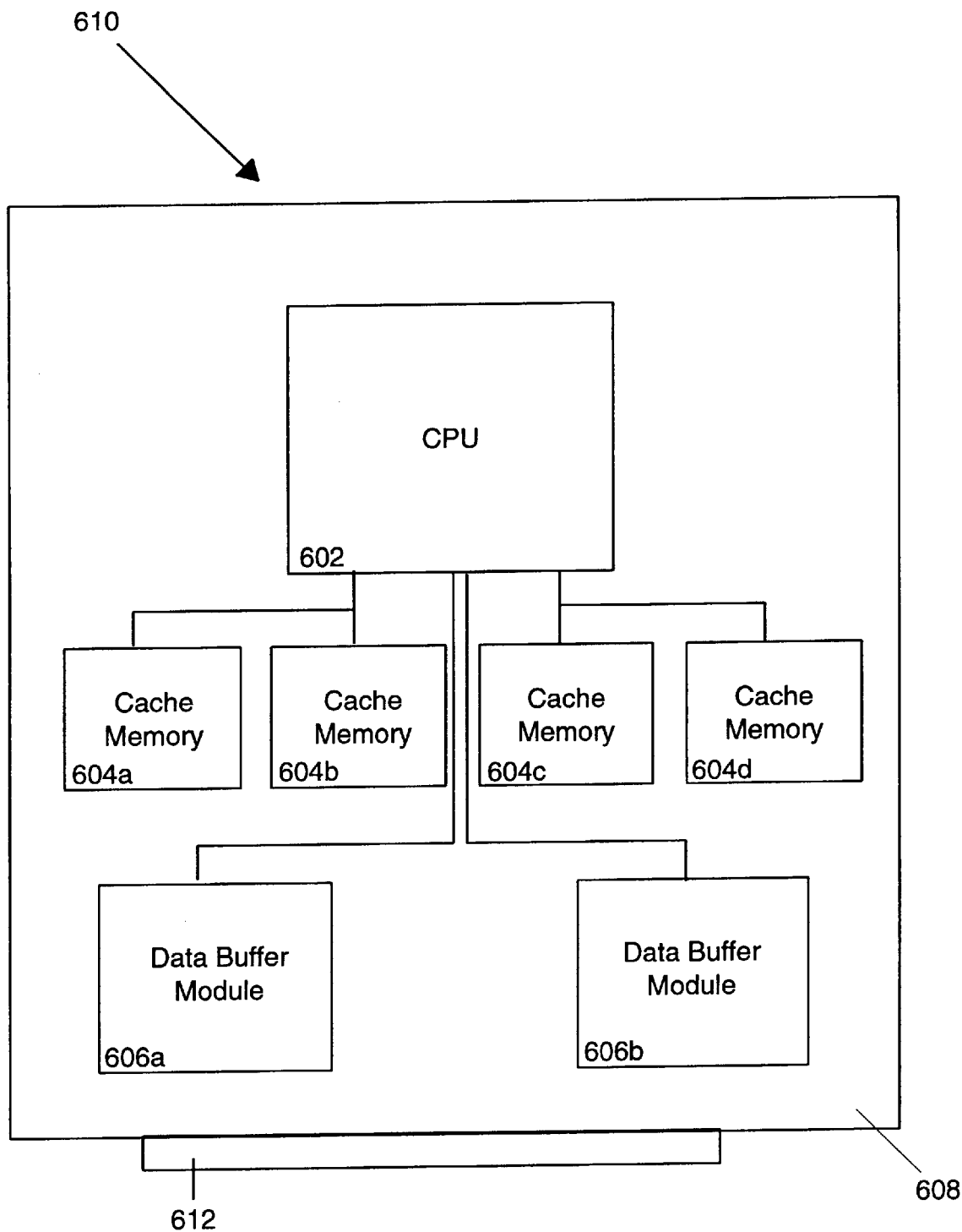
FIG. 6 is a replaceable CPU module in accordance with one embodiment of the present invention.

FIG. 6 is a replaceable CPU module 610 in accordance with one embodiment of the present invention. The CPU module includes a CPU 602), a printed circuit board 608, and a CPU module connector 612. Additionally, the CPU module may include support devices, such as cache memory modules (604a~604d) and data buffer modules (606a and 606b). The CPU 602, cache memory 604, and data buffers 606 are mounted onto the printed circuit board 608 and coupled together using conventional techniques. A housing (not shown) may enclose the CPU, cache memory, data buffers, and printed circuit board. The CPU is bidirectionally coupled through the printed circuit board to the system bus of the motherboard. The CPU module connector 612 may be configured to allow perpendicular coupling of the CPU module 610 to the motherboard 102 (as shown in FIG. 1).

The CPU module is one example of a component on the motherboard that may be configured to be replaceable. Specifically, the connector 108 on the motherboard 102 for receiving the CPU module 110 and the CPU module connector 612 on the CPU module 610 may be configured to enable easy replacement of the CPU module 110. Thus, when a newer, faster CPU is designed, one may remove the older, slower CPU module and replace it with the newer, faster CPU module.

By way of another example, memory modules and associated memory connections may be configured to allow upgrading of the memory modules. Each memory module (e.g., DIMM card 106) may include a plurality of memory chips mounted on a PCB. An individual memory module may contain a number of different memory chip configurations. For example, one memory module may contain 4 megabytes (MB) of memory chips, while another memory module may contain 16 MB of memory chips. Thus, one may upgrade their computer memory by replacing existing memory modules with memory modules that contain different configurations of memory chips.

Figure 3A:
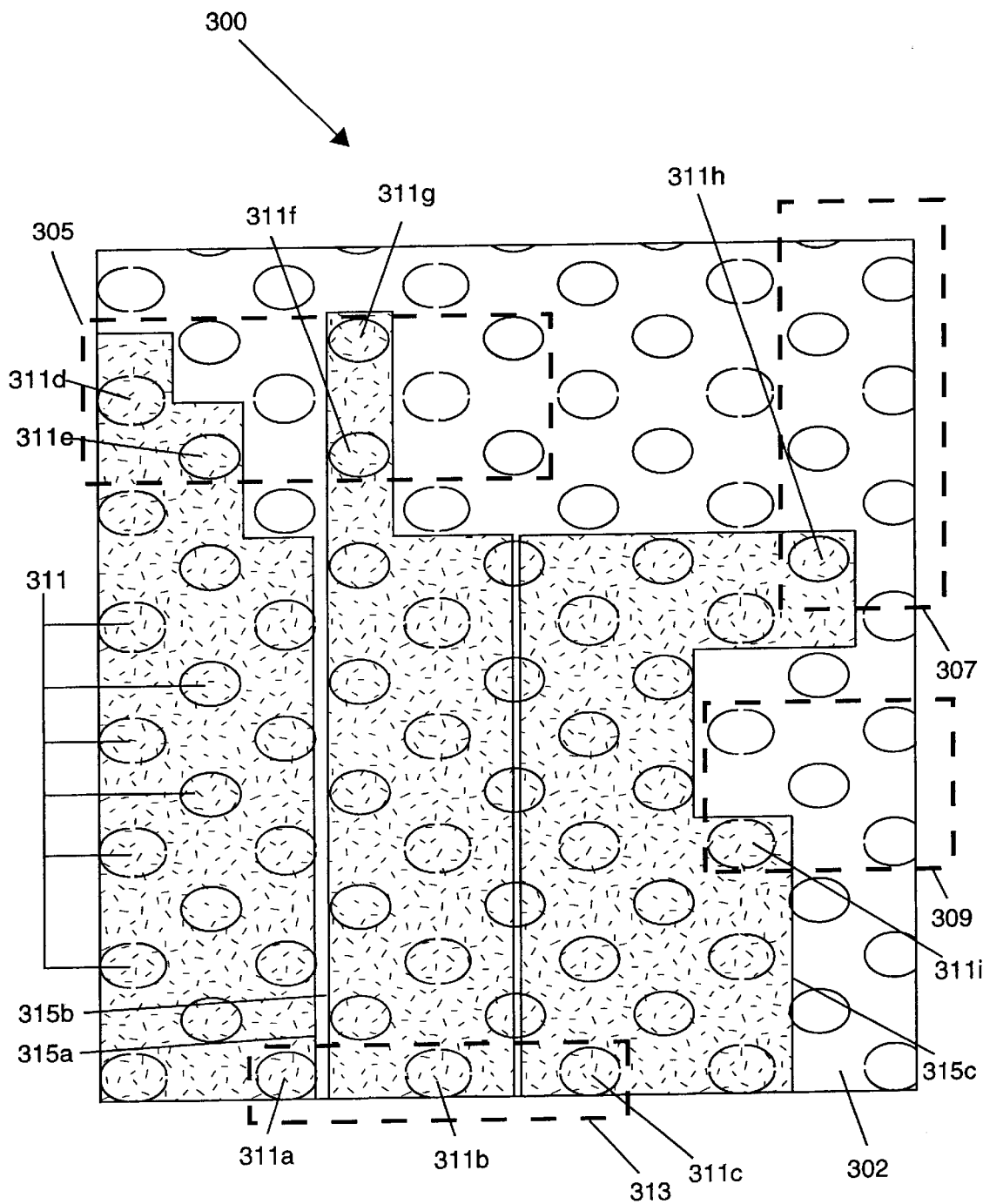
FIG. 3A is a cut-away top view of a portion of a motherboard with a power plane that is subdivided into power islands in accordance with one embodiment of the present invention.
Figure 3B:
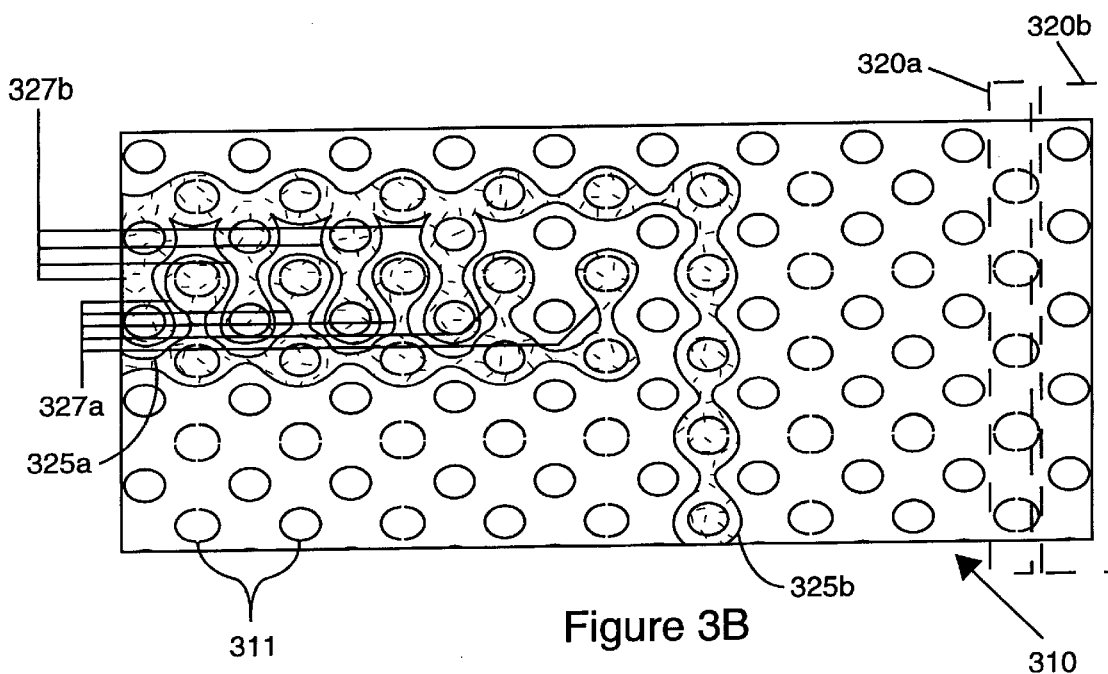
FIG. 3B is a detailed view of the CPU module connector of the motherboard of FIG. 3A.
Figure 4:
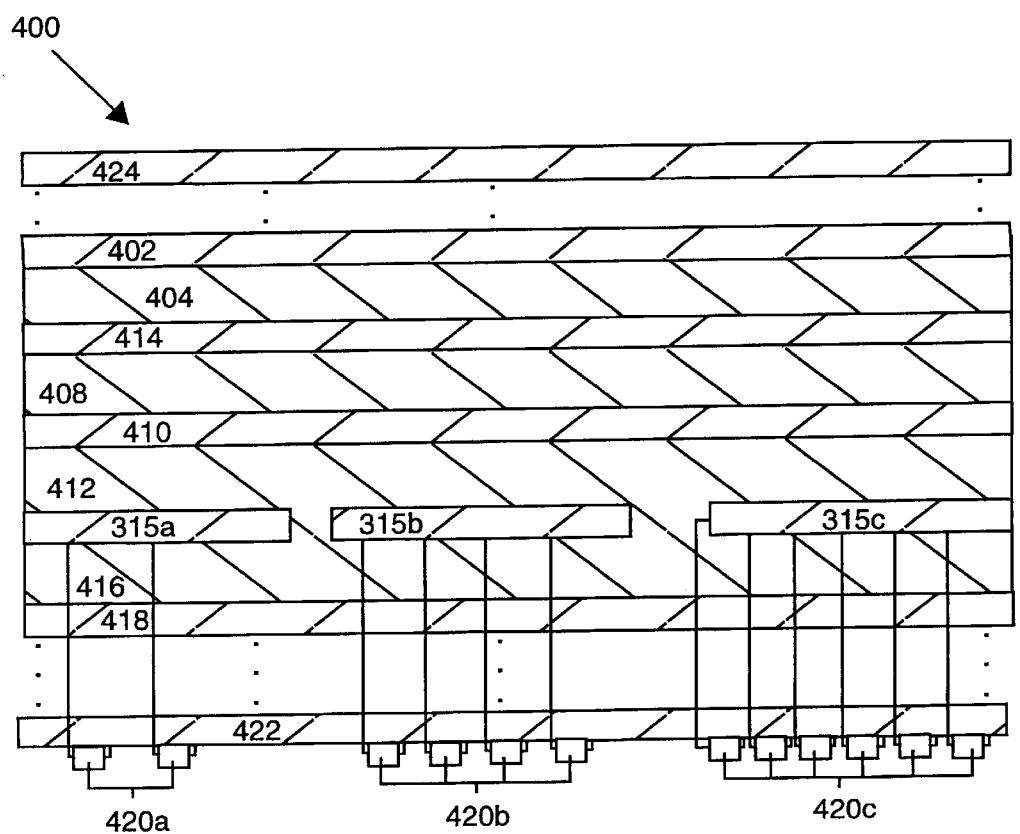
FIG. 4 is a side view of the motherboard of FIG. 3 that has a plurality of layers that includes power islands in accordance with one embodiment of the present invention.

As previously discussed in general, besides having replaceable components, a motherboard in accordance with the present invention includes EMI/RFI suppression structures that are configured to be adaptably selected upon insertion of particular replaceable components. One example of power islands in accordance with one embodiment of the present invention will now be described in reference to FIGS. 3A, 3B, and 4. FIG. 3A is a cut-away top view of a portion of a motherboard 302 with a power plane 300 that is subdivided into power islands 315a, 315b, and 315c in accordance with one embodiment of the present invention. FIG. 3B is a detailed view of the CPU module connector 305 of the motherboard of FIG. 3A. FIG. 4 is a side view of the motherboard 302 of FIG. 3 that has a plurality of layers that includes the power islands 315a through 351c in accordance with one embodiment of the present invention.

In this embodiment, each power island is configured to suppress EMI/RFI at a particular frequency. As shown in FIG. 4, each power island (e.g., 315a~315c) includes a network of bypass capacitors (420a~420c) that are configured to attenuate EMI/RFI for a particular frequency or frequency band. That is, the values of each capacitor within each network is carefully selected, as well as the position of each capacitor.

Each capacitor network is electrically coupled between an associated power island and a ground plane 418. For example, the networks of bypass capacitors 420a through 420c are connected to power island 315a through 315c, respectively. Preferably, the networks of capacitors are placed on the motherboard's back surface 422 which surface is opposite the motherboard's top surface 324.

As described above, the power islands are carefully configured so as to allow the automatic selection of appropriate power islands when a component is inserted. In this embodiment, a CPU module connector is connected with multiple power islands, while all other miscellaneous connectors are coupled with another power island. In this embodiment, power islands 315a and 315b are connected to a CPU module connector 305, and power island 315c is connected to miscellaneous connectors 307 and 309 of other components on the motherboard 302.

Each connector is electrically coupled to an associated power island through interconnect holes 311 using conventional interconnecting techniques. When a component is inserted into a connector, the appropriate power islands are automatically coupled to power pins of the inserted component since the power pins are electrically coupled to associated interconnect holes. By way of example, when a component is inserted into CPU module connector 305, interconnect hole 311f may receive a power pin of the inserted component, while interconnect holes 311d and 311e may receive disconnect pins of the inserted components. Thus, disconnect pins would be coupled to power island 315a, and power pins would be coupled to power island 315b. As a result of the inserted component's pin configuration and the power islands' configuration, the inserted component's power would then be electrically coupled to power island 315b.

Preferably, the power islands will be interwoven around particular interconnect holes of the CPU module connector. As shown in FIG. 3B, for example, a CPU module connector 310 is configured to have a plurality of interconnect holes 311 for receiving a plurality of pins. Additionally, many of these pins may be utilized as power connections. For example, a CPU module connector may include 500 or more pins, where 125 pins are power pins. In this embodiment, each row 320 of interconnect holes are offset from one another to allow easy routing of the power islands. For example, the interconnect holes of row 320a are not aligned with the interconnect holes of row 320b. As a result of this misalignment, a power island 325a may easily be routed to power pins and interwoven around power island 325b. More specifically, arms of one power island may be interwoven between the arms of another power island. As shown, arms 327b of power island 325a are interwoven between arms 327a of power island 325a.

As a result of the configurations of the power islands and inserted component's pins, suitable power islands are automatically selected upon insertion of the particular component (e.g., CPU module connector 305) so as to suppress EMI/RFI at frequencies that are emitted by that particular component. For example, the power island 315a of FIG. 3A may be suitably connected to power pins of a component that operates at a first frequency, while power island 315b may be suitably connected to power pins of a component that operates at a higher second frequency. Alternatively, it may be appropriate to connect both power islands 315a and 315b to a component that operates at a third frequency.

As shown in FIG. 4, the power islands (e.g., 315a~315c) may reside on the same level. Preferably, the power islands (e.g., 315a~315c) are electrically coupled to the same voltage supply. For example, the power islands may all be connected to a 5 volt power supply. In this embodiment, a second power plane 414 resides on a second level that is above the power islands. Preferably, the second power plane 414 is electrically coupled to a second power supply, e.g. 3 volts. Additionally, a signal trace layer 410 may be located between the power islands (e.g., 315a~315c) and the second power plane 414. Preferably, a ground plane 402 is positioned above the second power plane 414, and a ground plane 418 is positioned below the power islands (e.g., 315a~315c). Insulating layers 404, 408, 412, and 416 are positioned between the power islands, ground planes, and signal trace layer 410.

Although in this example, the power islands 315a, 315b, and 315c are on the same level, in another embodiment, the power islands may be on different levels. For example, power island 315a may be on a different level than power island 315b. Additionally, in other embodiments, the power islands may be connected to different voltage supplies. For instance, power island 315a may be connected to a 5 volt supply, and power island 315c may be connected to a 3 volt supply.

Although FIGS. 3A and 3B show only two power islands (e.g., 315a and 315b) are selectable for only one component 305, power islands may be configured to be selectable for any number of replaceable components on a particular motherboard or PCB. Additionally, each component connector may connect to more than two power islands. In other words, each component connector may be coupled to as many power islands as required by the particular operating frequencies of the inserted components. Additionally, when a component is inserted into the component connector, the power pins of the inserted component may be configured to connect to one or more power islands, depending upon which frequencies of the inserted component require RFI/EMI attenuation or suppression.

Figure 5:
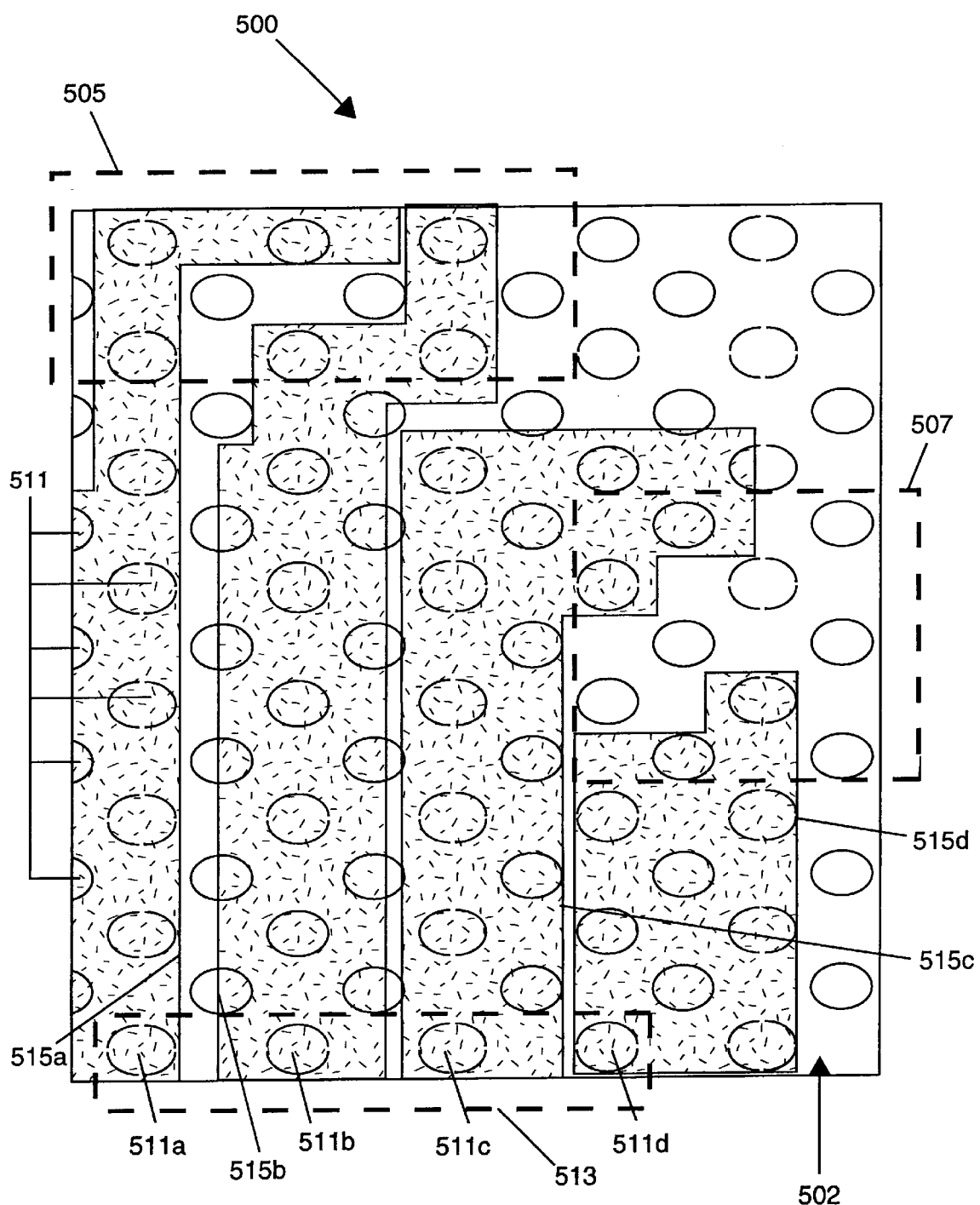
FIG. 5 is a cut-away top view of a portion of a motherboard with a power plane that is subdivided into power islands in accordance with an alternative embodiment of the present invention.

For example, FIG. 5 is a cut-away top view of a portion of a motherboard 502 with a power plane 500 that is subdivided into power islands 515a through 515d in accordance with an alternative embodiment of the present invention. As shown, power islands 515a and 515b are coupled to interconnect holes 511 of a connector for component 505, and power islands 515c and 515d are coupled to interconnect holes of a connector for component 507. When component 505 is inserted, power pins of the component 505 may connect to power island 515a, 515b, or both. Likewise, when component 507 is inserted, power pins of the component 507 may couple with power island 515c, 515d, or both. Preferably, each power island is coupled to a separate power supply input (e.g., 511a~511d), and each power supply input is coupled to the same voltage level (e.g., power islands 515a through 515d are connected to a 5 volt power supply).

Figure 7:
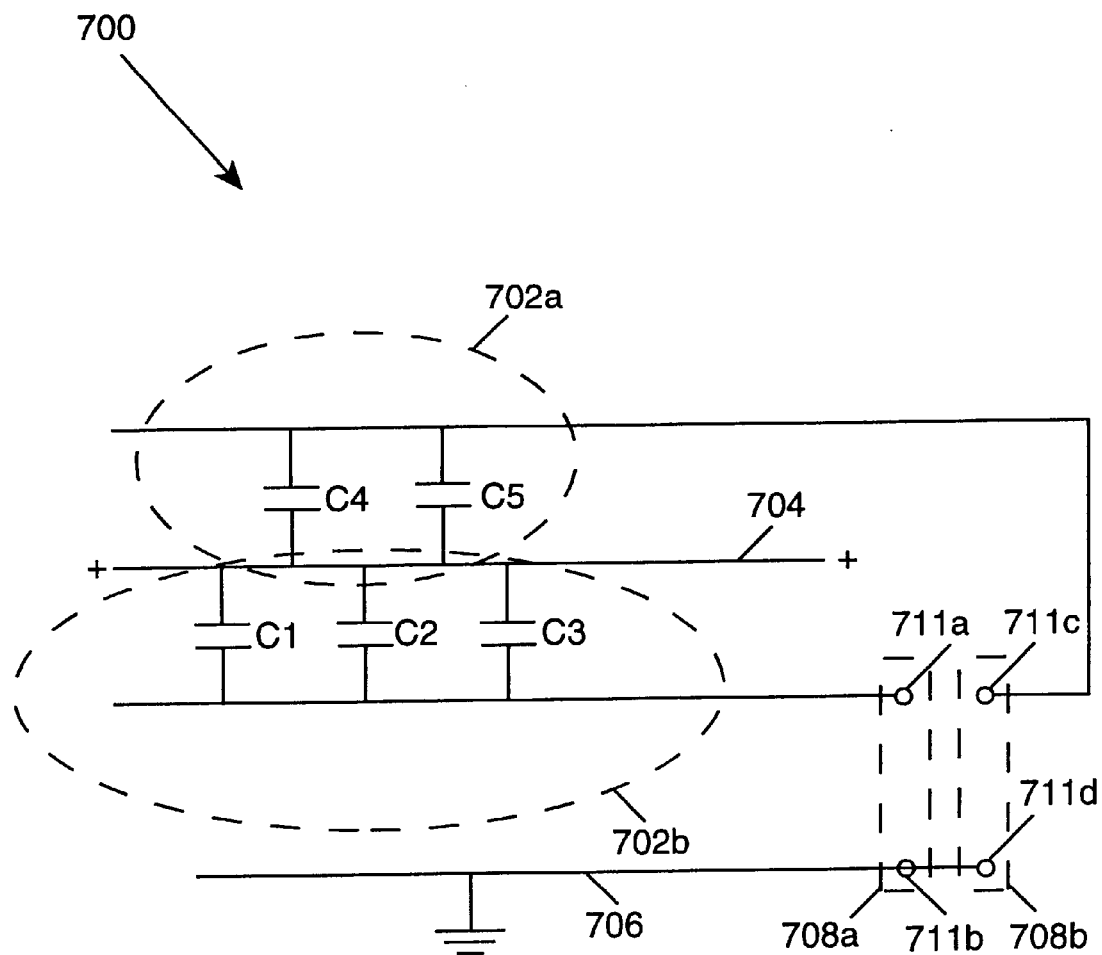
FIG. 7 is a diagrammatic representation of connections between interconnect holes and a plurality of capacitor networks in accordance with an alternative embodiment of the present invention.

Referring next to FIG. 7, an alternative embodiment of the present invention will be described. In this embodiment, the aforementioned power islands are not required. This is because pins of an electrical component are used to select and couple at least one of a plurality of capacitor networks between a power plane and a ground plane. FIG. 7 is a diagrammatic representation of potential component connections 708 made by inserted electrical components. An inserted component's pins are used to form a connection (e.g., 708a) that couples a capacitor networks (e.g., 702b) between a power and ground plane.

As shown, connector holes 711b and 711d are coupled with ground plane 706. Connector hole 711a is coupled with capacitor network 702b, and connector hole 711c is coupled with capacitor network 702a. This configuration allows the automatic selection of one of the capacitor networks upon insertion of an appropriate component. For example, when a first component is inserted, the inserted first component may be configured to couple connector holes 711a and 711b. Thus, the capacitor network 702b would be coupled with ground plane 706 through pins of the first component. By way of another example, a second component may be configured to couple connector holes 711c and 711d so that the capacitor network 702a is coupled with ground plane 706 through pins of the second component. Thus, the motherboard may be configured to allow automatic coupling of one or more capacitor networks to the ground plane through an inserted components pins.

Although this alternative embodiment has been described as using component pins to automatically couple one or more capacitor networks to a ground plane, of course, it should be well understood that the component may be used to automatically couple one or more capacitor networks to a power plane. In more general terms, an inserted component's pins may be used to couple a capacitor network between power and ground. Additionally, it should be well understood that this alternative embodiment may be implemented with many of the features of the previously described embodiments. For example, multiple power islands may also be implemented in this embodiment. That is, component pins may be used to automatically couple a power island (and associated capacitor networks) to a power pin of the component, as well as to automatically couple selected capacitor networks within the selected power island between power and ground. Alternatively, a first power island may be used exclusively for the inserted component, while a second power island is used for all other secondary components of the motherboard. The inserted component is then used to couple selected capacitor networks between the first power island of the inserted component and ground plane.

The present invention has many noteworthy advantages. For example, since the power islands are configured to be selectable for many different types of replaceable components, redesign of the power island configuration is not necessary each time a component is upgraded, for example, to a higher operating frequency. That is, since the power islands are carefully configured such that each island attenuates EMI/RFI at a particular frequency band and one or more power islands will attenuate EMI/RFI for each type of component, a component may be easily upgraded and previously designed power islands will automatically connect to a new component's power pins and suppress EMI/RFI emitted from that new component. Thus, the present invention may result in a significant man-hour reduction and corresponding costs associated with upgrading components in a computer system.

Although the foregoing invention has been described in some detail for purposes of clarity of understanding, it will be apparent that certain changes and modifications may be practiced within the scope of the appended claims. For example, although the multiple power island configurations of current invention have been described as being applicable to CPU module connectors, the power islands of the current invention may be applied to any connectors that are configured to receive upgradeable components, such as ASIC's that operate at high frequencies. By way of another example, although the replaceable components have been described as including two components that operate at two different frequencies, the replaceable components may also include components that operate at several different frequencies. Accordingly, the present embodiments are to be considered as illustrative and not restrictive, and the invention is not to be limited to the details given herein, but may be modified within the scope and equivalents of the appended claims.

What is claimed is:

1. A printed circuit board for attaching electronic components, the printed circuit board comprising:
   a power plane that is subdivided into a plurality of power islands;
   a ground plane;
   a plurality of bypass capacitors, each bypass capacitor being connected between the ground plane and an associated one of the power islands;
   a connector mounted on the printed circuit board for receiving electrical components, wherein the connector is connected to at least two selected power islands and the ground plane, wherein the selected power islands are arranged such that when a first electrical component is inserted into the connector, a first one of the selected power islands is automatically connected to a power supply pin of the first electrical component to facilitate attenuation of electromagnetic interference generated by the first electrical component in a first frequency band, and when a second electrical component is inserted into the connector, a second one of the selected power islands is automatically connected to a power supply pin of the second electrical component to facilitate attenuation of electromagnetic interference generated by the second electrical component in a second frequency band that is different then the first frequency band.

2. A printed circuit board as recited in claim 1 wherein:
   when the second electrical component is inserted into the connector, the first selected power island is automatically connected to a second power supply pin of the second electrical component; and
   when the first electrical component is inserted into the connector, the second selected power island is not electrically connected to any power supply pin of the first electrical component.

3. A printed circuit board as recited in claim 1 further comprising a third power island that is not electrically coupled to the connector.

4. A printed circuit board as recited in claim 3 further comprising a plurality of secondary electrical components that are mounted on the printed circuit board and are electrically connected to the third power island.

5. A printed circuit board as recited in claim 1 wherein the selected power islands are arranged to couple to power supplies having the same voltage.

6. A printed circuit board as recited in claim 1 wherein the first electrical component is a first CPU module, and the second electrical component is a second CPU module, the second CPU module operating at a higher frequency than the first CPU module.

7. A printed circuit board as recited in claim 6, each of the first and second CPU modules comprising:
   a CPU printed circuit board;
   a CPU that operates at least at one frequency and is mounted on the CPU printed circuit board, the CPU having a plurality of power pins for connecting to at least one of the power islands;
   at least one cache memory module mounted on the CPU printed circuit board and electrically coupled to the CPU; and
   at least one data buffer module mounted on the CPU printed circuit board and electrically coupled to the CPU.

8. A printed circuit board as recited in claim 1 wherein each of the first and second electrical components has a plurality of power pins for electrically coupling to at least one of the selected power islands.

9. A printed circuit board as recited in claim 1 further including a plurality of layers, the plurality of layers comprising:
   a plurality of power planes that includes the first power plane and a second power plane;
   a signal trace layer positioned between two of the plurality of power planes, wherein the plurality of power planes and the signal trace layer form a stack with a top and a bottom; and
   a plurality of ground planes that include the first ground plane and a second ground plane, wherein the first ground plane is positioned above the top of the stack and the second ground plane is positioned below the bottom of the stack.

10. A printed circuit board as recited in claim 9 wherein the first power plane is electrically coupled to a first power supply having a first voltage level, and the second power plane is electrically coupled to a second power supply having a second voltage level.

11. A printed circuit board as recited in claim 9 wherein the first and second power planes are electrically coupled to a power supply having a same voltage level.

12. A printed circuit board as recited in claim 9 wherein the plurality of bypass capacitors are placed connected to the second ground plane.

13. A printed circuit board as recited in claim 1 wherein each of the bypass capacitors associated with the first power island has a first selected capacitance value and a first selected position to facilitate attenuation of electromagnetic interference generated by the first electrical component at the first frequency band, and each of the bypass capacitors associated with the second power island has a second selected capacitance value and a second selected position to facilitate attenuation of electromagnetic interference generated by the second electrical component at the second frequency band.

14. A printed circuit board as recited in claim 13 wherein each of the first capacitance values are not identical and each of the second capacitor values are not identical.

15. A printed circuit board as recited in claim 13 wherein the first selected capacitance value and first selected position are to facilitate further attenuation of electromagnetic interference generated by the first electrical component at a third frequency band.

16. A printed circuit board as recited in claim 4, wherein the printed circuit board is a computer motherboard further comprising:
   an I/O interface for electrically coupling a plurality of external peripherals to the computer motherboard;
   a plurality of peripheral connectors for receiving peripheral modules and for electrically coupling an inserted peripheral module to the computer motherboard; and
   a plurality of memory connectors for receiving memory modules and for electrically coupling an inserted memory module to the computer motherboard.

17. A printed circuit board as recited in claim 1 wherein when the second electrical component is inserted into the connector, the first selected power island is automatically connected to a disconnect pin of the second electrical component.

18. A printed circuit board as recited in claim 17 wherein when the first electrical component is inserted into the connector, the second selected power island is automatically electrically connected to a disconnect pin of the first electrical component.

19. A computer system comprising:
   a printed circuit board as recited in claim 1;
   a grounded chassis for holding the printed circuit board;
   an I/O interface that includes a plurality of I/O connectors for electrically coupling a plurality of peripherals to the printed circuit board; and
   a cover that encloses the printed circuit board for protecting the printed circuit board from damage.

20. A method for automatically selecting a plurality of bypass capacitors on a printed circuit board when an electrical component of the printed circuit board is replaced or upgraded, the method comprising:
   providing a printed circuit board with a plurality of layers that include a first power plane and a first ground plane, the printed circuit board having a top surface and a bottom surface, and the first power plane having a plurality of independent power islands;
   mounting a connector on the top surface of the printed circuit board, wherein the connector is connected to at least two selected power islands;
   mounting a plurality of bypass capacitors on the bottom surface of the printed circuit board, each of the plurality of bypass capacitors being selected to electrically couple to the ground plane and an associated power island;
   inserting a first electrical component into the connector; and
   upon insertion, automatically connecting a first one of the power islands to power supply pins of the first electrical component to facilitate attenuation of electromagnetic interference generated by the first electrical component at a first frequency.

21. A method as recited in claim 20 further comprising:
   removing the first electrical component;
   inserting a second electrical component into the connector; and
   upon insertion, automatically connecting a second one of the power islands to power supply pins of the second electrical component to facilitate attenuation of electromagnetic interference generated by the second electrical component at a second frequency.

22. A method as recited in claim 21 wherein
   when the second electrical component is inserted into the connector, the first selected power islands is automatically connected to a second power supply pin of the second electrical component; and
   when the first electrical component is inserted into the connector, the first selected power island is not electrically connected to a power supply pin of the first electrical component.

23. A method as recited in claim 21 wherein
   when the first electrical component is inserted into the connector, the second selected power islands is automatically connected to a second power supply pin of the first electrical component; and
   when the second electrical component is inserted into the connector, the second selected power island is not electrically connected to a power supply pin of the second electrical component.

24. A method as recited in claim 20 wherein the first power plane includes a third power island that is not electrically connected to the connector.

25. A method as recited in claim 24 further comprising mounting a plurality of secondary components on the printed circuit board and electrically coupling the plurality of secondary components to the third power island.

26. A method as recited in claim 20 wherein the selected power islands are arranged to couple to power supplies having the same voltage.

27. A method as recited in claim 21 wherein each of the first and second electrical components has a plurality of power pins for electrically coupling to at least one of the selected power islands.

28. A method as recited in claim 21 wherein the selection of each bypass capacitor includes selecting a capacitor value and a capacitor position on the printed circuit board to facilitate attenuation of electromagnetic interference generated by one of the first and second electrical component at least for one designated frequency.

29. A printed circuit board for attaching electronic components, the printed circuit board comprising:

a power plane;

a ground plane;

a plurality of capacitor networks;

a connector mounted on the printed circuit board for receiving electrical components, the connector being configured to couple a first one of the plurality of capacitor networks between the ground plane and the power plane when a first electrical component is inserted into the connector and the first capacitor network being configured to facilitate attenuation of electromagnetic interference generated by the first electrical component in a first frequency band.

30. The printed circuit board recited in claim 29, wherein the connector is configured to couple a second one of the plurality of capacitor networks between the ground plane and the power plane when a second electrical component is inserted into the connector and the second capacitor network being configured to facilitate attenuation of electromagnetic interference generated by the second electrical component in a second frequency band that is different from the first frequency band.

31. A printed circuit board as recited in claim 29 further comprising a plurality of secondary electrical components that are mounted on the printed circuit board and are electrically connected to a third one of the plurality of capacitor networks.

32. A printed circuit board as recited in claim 29 wherein the first electrical component is a first CPU module, and the second electrical component is a second CPU module, the second CPU module operating at a higher frequency than the first CPU module.

33. A printed circuit board as recited in claim 29 wherein the first capacitor network has a first plurality of capacitor values and capacitor positions to facilitate attenuation of electromagnetic interference generated by the first electrical component at the first frequency band, and the second capacitor network has a second plurality of capacitor values and capacitor positions to facilitate attenuation of electromagnetic interference generated by the second electrical component at the second frequency band.

34. A printed circuit board as recited in claim 33, wherein the first plurality of capacitor values and capacitor positions are not identical to the second plurality of capacitor values and capacitor positions.

35. A printed circuit board as recited in claim 29, wherein the connector is configured to couple the first capacitor network to the ground plane through pins of the first electrical component when the first electrical component is inserted.

36. A printed circuit board as recited in claim 29, wherein the connector is configured to couple the first capacitor network to the power plane through pins of the first electrical component when the first electrical component is inserted.

* * * * *